United States Patent [19]
Kim et al.

[11] Patent Number: 5,945,256
[45] Date of Patent: Aug. 31, 1999

[54] EXPOSING METHODS IN PHOTOLITHOGRAPHY USED FOR MANUFACTURING A LIQUID CRYSTAL DISPLAY

[75] Inventors: Dong-Kyu Kim; Jung-Hee Lee, both of Kyungki-do, Rep. of Korea

[73] Assignee: Samsung Electronics Co., Ltd., Rep. of Korea

[21] Appl. No.: 09/066,908

[22] Filed: Apr. 28, 1998

[30] Foreign Application Priority Data

Dec. 6, 1997 [KR] Rep. of Korea ............ 97-66461

[51] Int. Cl.⁶ .................................................. G03F 7/00
[52] U.S. Cl. ........................ 430/312; 430/319; 430/321
[58] Field of Search ........................ 430/22, 312, 321, 430/319, 322, 323, 325, 394, 396; 355/77

[56] References Cited

U.S. PATENT DOCUMENTS

| | | | |
|---|---|---|---|
| 5,026,143 | 6/1991 | Tanaka et al. | 350/336 |
| 5,656,526 | 8/1997 | Inada et al. | 430/314 |
| 5,795,686 | 8/1998 | Takizawa et al. | 430/5 |

*Primary Examiner*—John A. McPherson
*Attorney, Agent, or Firm*—Myers Bigel Sibley & Sajovec

[57] ABSTRACT

A substrate for a microelectronic device is divided into at least two regions and a boundary region therebetween. The boundary region includes a first portion and a second portion. The boundary region may have subregions having equal area, and the sub-regions are arranged in a matrix shape to form the first portion and the second portion A photoresist is coated on the substrate. Portions of the photoresist on the first region and the first portion is exposed to light through a mask for photolithography, and other portions of the photoresist on the second region and the second portion is then exposed to light through the mask. The area of the sub-regions of the first portion in a column becomes larger as goes to the first region, while that of the second portion becomes smaller.

7 Claims, 8 Drawing Sheets

EXPOSING METHODS IN PHOTOLITHOGRAPHY USED FOR MANUFACTURING A LIQUID CRYSTAL DISPLAY

BACKGROUND OF THE INVENTION (a) Field of the Invention

The present invention relates to exposing methods in photolithography, for manufacturing microelectronic devices and a manufacturing method of a liquid crystal display using the same.

(b) Description of the Related Art

Patterns of microelectronic devices such as liquid crystal displays and semiconductor devices are generally formed by using photolithography. In photolithography, there are two techniques for projecting a mask image onto a photoresist coated on the surface of a device in order to form a pattern. The one is to perform only one exposing step for all over the surface of the device, and the other is to perform at least two exposing steps for the surface of the device. The latter technique called step-and-repeat technique divides the surface of the device into a plurality of exposure regions, projects an image onto only one exposure region and step-and-repeat across the surface.

Although the step-and-repeat technique it may give accurate patterns relative to the former technique, it may give rise to misalignment between the exposure regions. The misalignment may be resulted from the accuracy limitation of the exposure equipment, and may result in shift, rotation and distortion of the patterns, thereby causing defects such as disconnection of the wirings and differences in electrical properties between the exposure regions.

For example, storage capacitances and parasitic capacitances between data lines and pixel electrodes and between gate electrodes and drain electrodes in a liquid crystal display may be different between the exposure regions, and this may bring about the difference in the kickback voltage.

Figure 1:
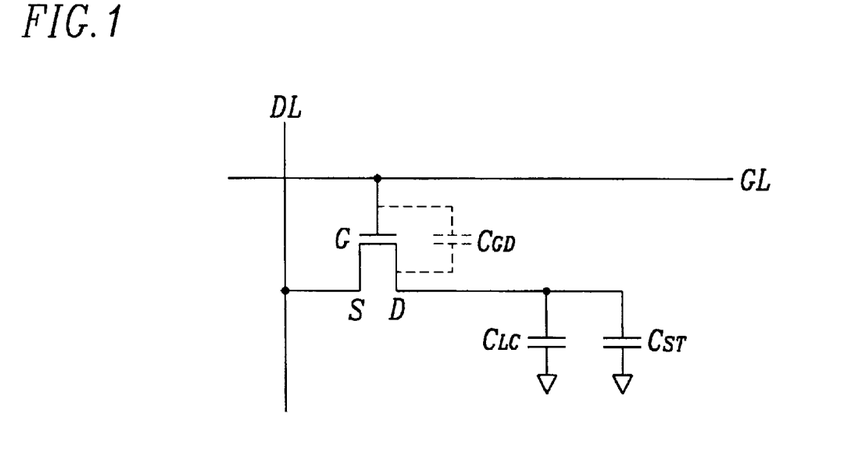
FIG. 1 is an equivalent circuit diagram for a pixel of a liquid crystal display.

Referring to FIG. 1, the relation between the kickback voltage and the capacitances of a liquid crystal display will be described in detail.

FIG. 1 is an equivalent circuit diagram of a pixel of a liquid crystal display. A gate line GL transmitting scanning signals and a data line DL transmitting image; signals cross each other, A gate G of a switching element such as a thin film transistor (TFT) is connected to the gate line GL, a source S is connected to the data line DL. A drain D of the TFT is connected to a liquid crystal capacitor $C_{LC}$ and a storage capacitor: $C_{ST}$. When the TFT-turns on by a gate on voltage of the scanning signal applied to the gate G, the image signal from the data line DL is then applied to the liquid crystal, capacitor $C_{LC}$ and the storage capacitor $C_{ST}$ as a voltage. When the TFT turns off, by a gate off voltage of the scanning signal, the applied voltage across the liquid crystal capacitor $C_{LC}$ and the storage capacitor $C_{ST}$ may maintain its value. However, a parasitic capacitor $C_{GO}$ betweeen the gate G and the drain D drops down the voltage across the liquid crystal capacitor $C_{LC}$. The voltage drop is called a kickback voltage $\Delta V$ and is obtained by; the expression, $$\Delta V = \frac{C_{gd}}{C_{lc} + C_{st} + C_{gd}} \times \Delta V_g,$$

where $C_{LC}$ is the capacitance of a liquid crystal capacitor $CL_{LC}$ $C_{ST}$ is the storage capacitance of a storage capacitor $C_{ST}$, $C_{Vf}$ is the parasitic capacitance between the gate G and the drain D, and $\Delta V_g$ is the voltage difference between the gate on voltage and the gate off voltage.

The difference in kickback voltages between the exposure regions may cause the difference in the brightness, which may be easily detectable near the boundaries of the exposure regions by users.

U.S. Pat. No. 5,026,143 discloses a device having a wiring, the width of which becomes wider near the boundary of the adjacent two exposure regions. Although this technique may reduce the disconnection of the wiring between the exposure regions, it may not solve the problem of the difference in the electrical properties such as kickback voltages.

SUMMARY OF THE INVENTION

It is therefore an object of the present invention to reduce the detectable difference in electrical properties near the boundaries of the exposure regions of a microelectronic device.

It is another object of the present invention to reduce the detectable difference in brightness near the boundaries of the exposure regions of a liquid crystal display.

These and other objects are provided, according to the present invention, by providing a boundary region between two adjacent exposure regions. The boundary region has a first and a second boundary portions, which are exposed when the first exposure region and the second exposure region are exposed, respectively, and the shape of the border between the first and the second boundary portion is not linear. The nonlinear border may prevent the user from easily detecting the difference in electrical properties between the exposure regions. For example, the brightness difference between the exposure regions in a liquid crystal display may not be easily detectable by the user.

In particular, a photoresist coated on a surface of a substrate is exposed to light through a mask, according to the present invention, by dividing the substrate into a first and a second regions and a boundary region between the first and the second regions where the boundary region has a first and a second boundary portions. A first portion of the photoresist on the first region and the first boundary portion and a second portion of the photoresist on the second region and the second boundary portion are exposed to light through the mask in sequence. According to the present invention, the shape of boundary between the first portion and the second portion of the photoresist is not linear. It is preferable that the area of the second boundary portion with respect to the area of the first boundary portion becomes larger as goes to the second region.

The exposing method may be adapted to liquid crystal displays.

Liquid crystal displays having a plurality of pixels are manufactured, according to the present invention, by forming a gate pattern including a plurality of gate lines and an array of gate electrodes connected thereto on a substrate. An array of channel layers is formed on the gate electrodes and is insulated from the gate electrodes. An array of source and drain electrodes is formed on the channel layers. An array of pixel electrodes is formed thereon and is respectively connected to the drain electrodes. According to the invention, at least one of the gate pattern, the array of the source and the drain electrodes, the array of the channel layers and the array of the pixel electrodes are formed by using the above-described exposing method. That is, at least one of the gate pattern and the arrays is manufactured by coating a photoresist and dividing the photoresist into a first and a second regions and a boundary region between the first and the second regions. The boundary region having a first portion and a second portion, and the first region and the first portion and the second region and the second portion are exposed to light through a mask in sequence. The area of the second portion becomes larger as goes to the second region.

A plurality of storage electrodes may be formed on the substrate. The storage electrodes overlap the pixel electrodes and are insulated from the pixel electrodes.

The boundary region may include a plurality of sub-regions having equal area. The sub-regions may be arranged in a matrix shape having a plurality of rows and columns, and the first and the second portions include the sub-regions. The number of the sub-regions of the second portion in a column of the matrix becomes larger as goes to the second region.

One sub-region may correspond to one pixel. Each pixel includes one of the pixel electrodes and a thin film transistor having respective one of the gate electrodes, the channel layers, the source electrodes and the drain electrodes.

DETAILED DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Figure 2:
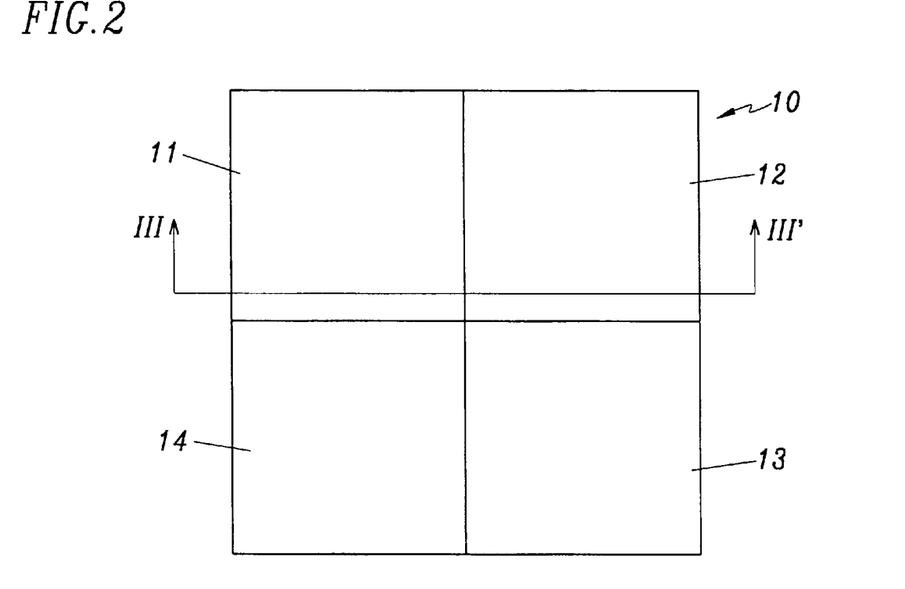
FIG. 2 shows a substrate for a microelectronic device according to the present invention.
Figure 3:
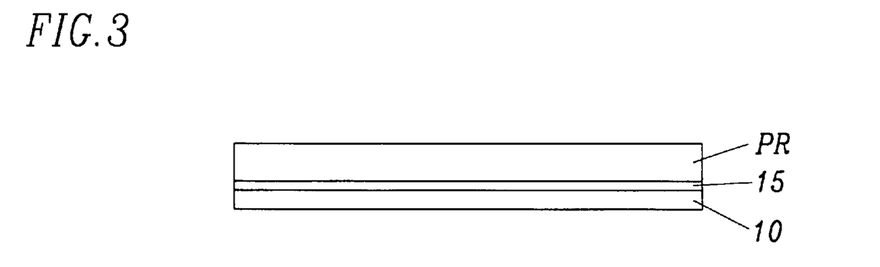
FIG. 3 is a sectional view taken along the line III–III' of FIG. 2.

FIG. 2 shows a substrate for a microelectronic device according to an embodiment of the present invention, and FIG. 3 is a sectional view taken along the line III–III' of FIG. 2.

As shown in FIGS. 2 and 3, a substrate 10 is divided into four imaginary regions, the first to the fourth exposure regions 11, 12, 13 and 14. In case of a liquid crystal display, the substrate 10 may be made of a transparent insulating material such as glass or quartz. However, the substrate 10 may be a semiconductor substrate when used for a semiconductor device. The substrate 10 may have patterns of wiring, electrodes or insulating films thereon, and may be divided into arbitrary number of imaginary regions. As shown in FIG. 3, a layer 15 of metal, semiconductor or insulating film is deposited on the surface of the substrate 10, and the layer 15 is coated with a photoresist PR. The portions of the photoresist on the first to the fourth exposure regions 11–14 are exposed to light through a mask (not shown) in sequence.

Figure 4:
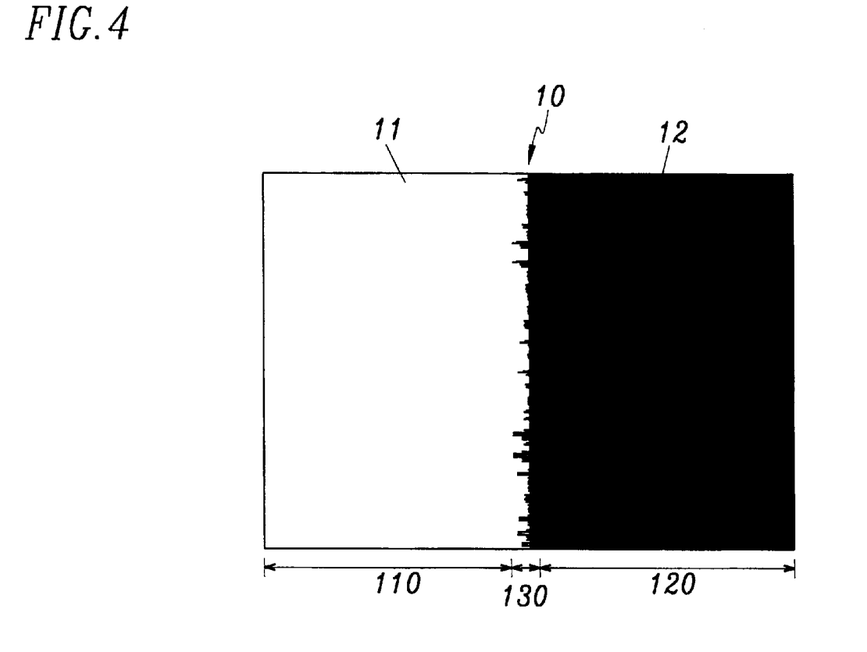
FIG. 4 is an enlarged view of the two exposed adjacent regions shown in FIG. 2.

FIG. 4 is an enlarged view of two adjacent regions 11 and 12 shown in FIG. 2.

As shown in FIG. 4, each region 11 or 12 has a main shot region 110 or 120, and the two adjacent regions 11 and 12 have a boundary region 130 near their boundary in common. Therefore, the boundary region 130 lies between the main shot regions 110 and 120 of the first and second exposure regions 11 and 12. The boundary region 130 has a first portion represented as a white portion and a second portion as a black portion in FIG. 4, and the boundary of the first and the second portion is not linear and saw-shaped.

First, the main shot region 110 of the first region 11 and the first portion of the boundary region 130 are exposed to light through a mask. Thereafter, the main shot region 120 of the second region 12 and the second portion of the boundary region 130 are exposed to light through the mask.

Figure 5:
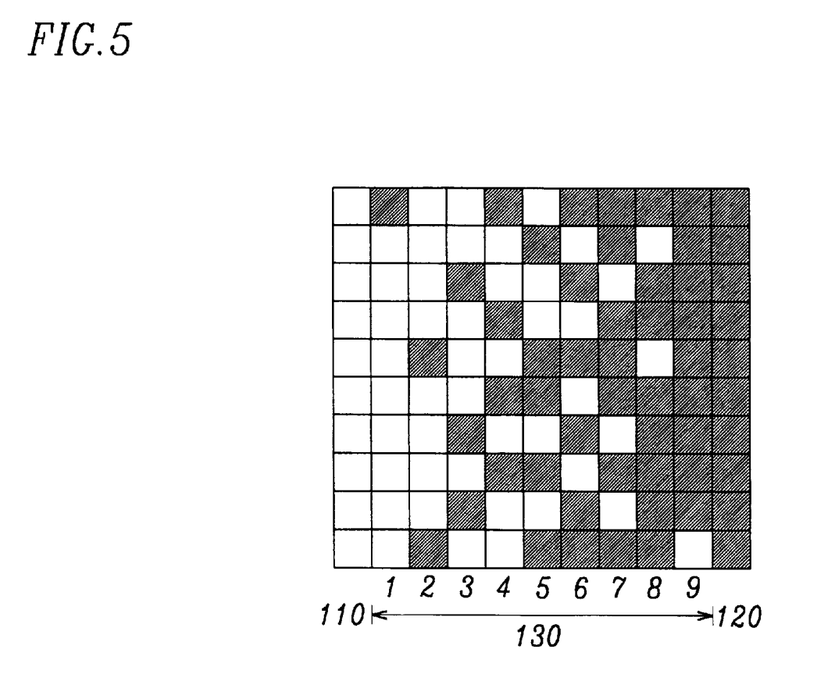
FIG. 5 is an enlarged view of an example, of the boundary region shown in FIG. 4.
Figure 6:
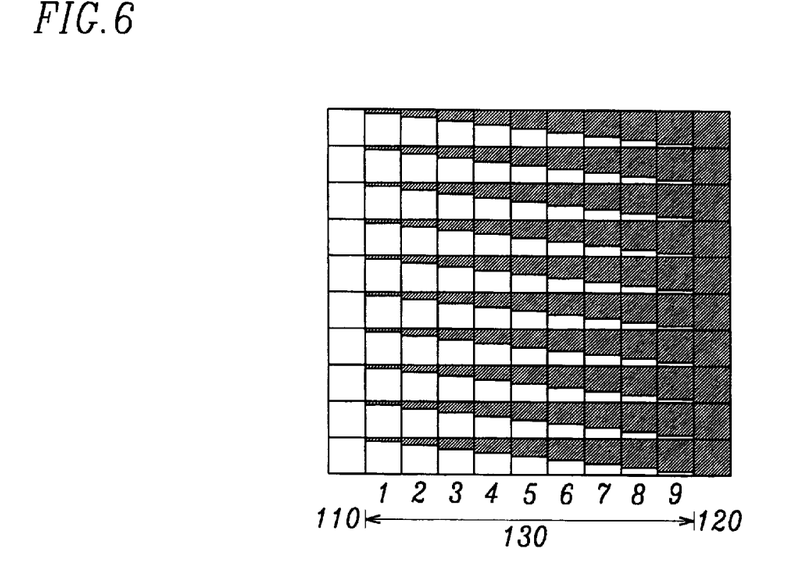
FIG. 6 is an enlarged view of another example of the boundary region shown in FIG. 4.

The first and the second portion may have arbitrary shapes. For example, as shown in FIGS. 5 and 6, the boundary region 130 is divided into a plurality of sub-regions having equal areas. The sub-regions are arranged in matrix shape, and may have shapes of such as rectangles or squares. FIGS. 5 and 6 shows rectangles arranged in the form of 10×11 matrix. The matrix assigns nine columns for the boundary region, and the leftmost and rightmost columns of the matrix are portions of the main shot regions 110 and 220 of the first and second regions 11 and 12, respectively.

As shown FIG. 5, the first portion is a group of white rectangles, and the second portion is a group of gray rectangles in the boundary region 130. The first column 1 of the boundary region 130 adjacent to the main shot region 110 of the first region 11 has nine white rectangles and one gray rectangles, and, on the contrary, the last column 9 of the boundary region 130 adjacent to the main shot region 120 of the first region 12 has one white rectangles and nine gray rectangles. The number of the white rectangles decreases as goes to the main shot region 120 of the second region 12, while the number of the gray rectangles increases. It is desirable that the rectangles having the same color are separate from each other and the different color rectangles are adjacent to each other and mixed with each other, because if it is not, the screen, in case of a liquid crystal display, may have spots in the boundary region.

As shown in FIG. 6, each rectangle in the boundary region 130 is divided into a white part and a gray part, and the ratio of the areas of the white part and the gray part in every rectangle in a column is the same. The first portion is a group of white parts of the rectangles and the second portion is a group of gray parts of the rectangles. The area of the white part of a rectangle in a column decreases and the area of the gray part increases as goes to the main shot region 120 of the second region 12.

In case of a liquid crystal display including a plurality of pixels, each sub-region may be a part of a pixel, a pixel or a plurality of pixel. However, it is preferable that the sub-region is a pixel, since the kickback voltage is generated by units of pixel.

In addition, the difference in brightness of the two exposure regions may not be easily detectable when the width of the boundary region 130 is large and the size of the sub-regions is small. However, they may be determined by the requirements of the liquid crystal display.

Figure 7A:
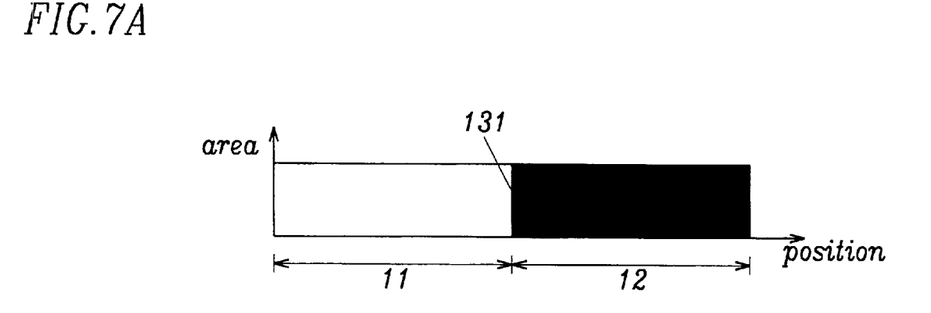
FIGS. 7A to 7C are diagrams showing the areas of the first and the second portions of the boundary region and the first and the second regions as a function of position.
Figure 7B:
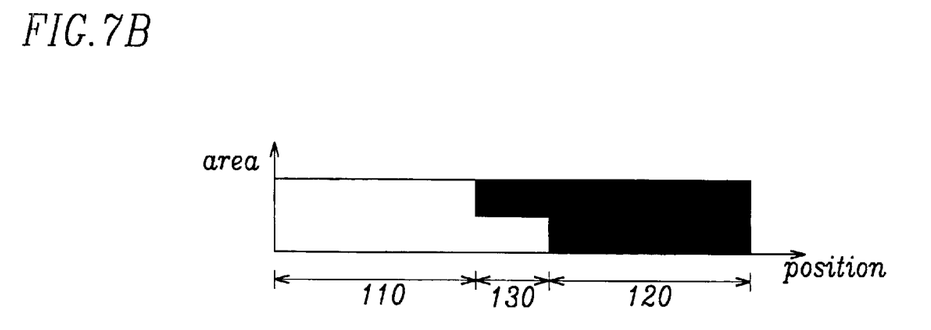
Figure 7C:
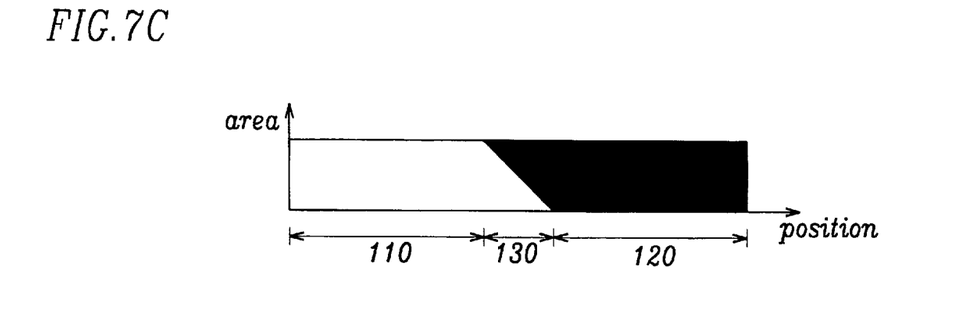

FIGS. 7A to 7C are diagrams showing the areas of the first and the second portions of the boundary region as a function of position. The area of the first portion and the main shot region of the first exposure region is white portion of the figures, and the area of the second portion and the main shot region of the second exposure region is black portion of the figures.

FIG. 7A shows a case that no boundary region exists. The main shot regions 110 and 120 of the first and the second regions 11 and 12 are equal to the first and the second regions 11 and 12, and the boundary 131 between the first and the second regions 11 and 12 appears as a longitudinal line.

FIG. 7B shows a case that the boundary region 130 has one or more columns, and the number or the total area of the sub-regions of the first portion in a column is equal to that of the sub-regions of the second portion. In case that the boundary region 130 has only one columns the boundary between the first and the second portions is rectangular waveform.

FIG. 7C shows a case that the boundary region 130 has a plurality of columns, and the number or the total area of the sub-regions of the second portion in a column becomes larger as goes to the second region, while that of the forst portion becomes smaller.

Figure 8A:
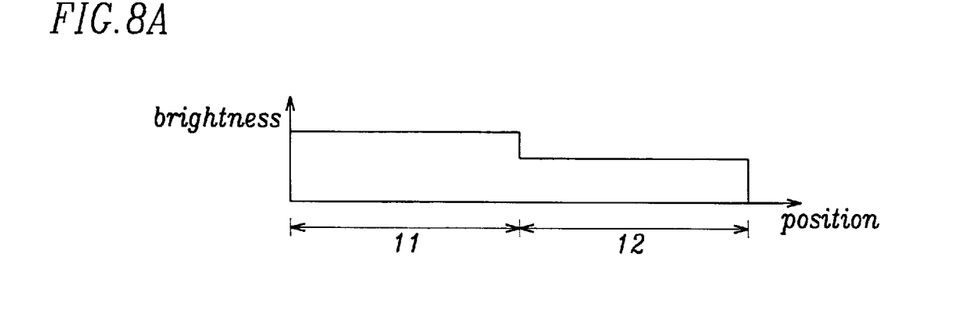
FIGS. 8A to 8C are diagrams showing the brightness of a liquid crystal display shown in FIGS. 7A to 7C as a function of position.
Figure 8B:
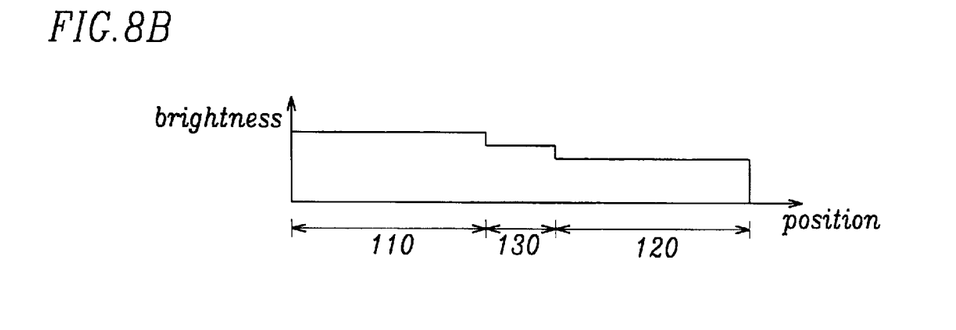
Figure 8C:
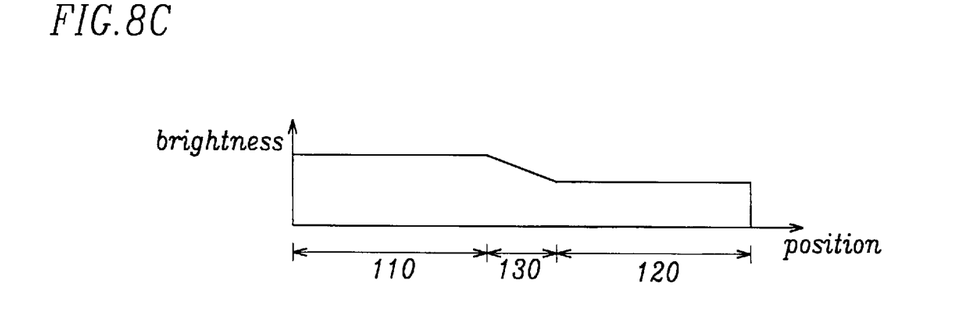

FIGS. 8A to 8C show brightness of the liquid crystal display shown in FIGS. 7A to 7C, respectively, as function of position. In these figures, the brightness of the main shot region of the first region and the first portion of the boundary region is assumed to be brighter than the main shot region of the second region and the second portion of the boundary region.

As shown in FIG. 8A, the brightness for the liquid crystal display shown in FIG. 7A is abruptly changed near the boundary of the first and the second regions 11 and 12, and the brightness for the liquid crystal display shown in FIG. 7B is step down at the boundary region 130 as shown in FIG. 8B. On the contrary, the brightness for the liquid crystal display shown in FIG. 7C is gradually reduced as shown in FIG. 8C, and thus the brightness difference may not be easily detectable by users.

This method may be adaptable to a thin film transistor liquid crystal display.

Figure 9:
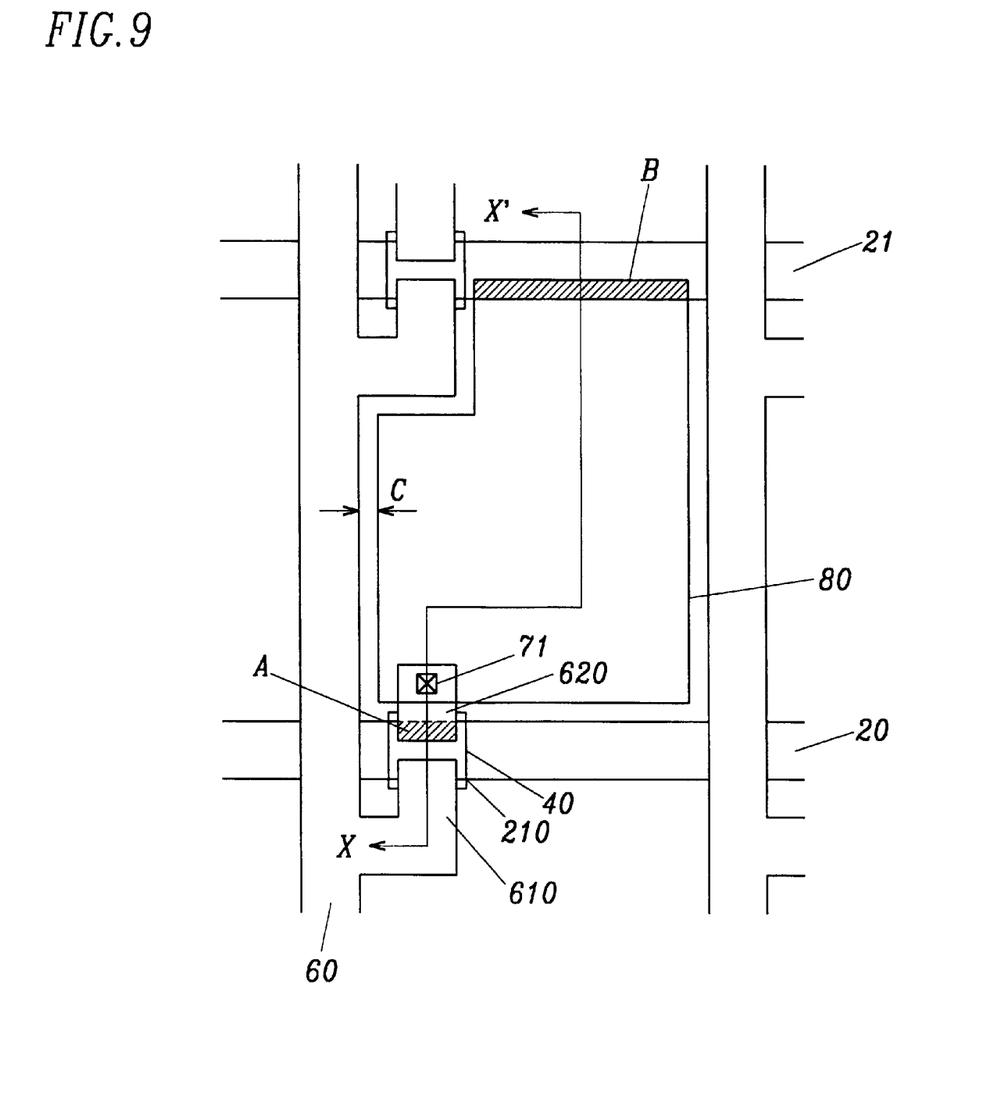
FIG. 9 is a layout view of a liquid crystal display according to an embodiment of the present invention.
Figure 10:
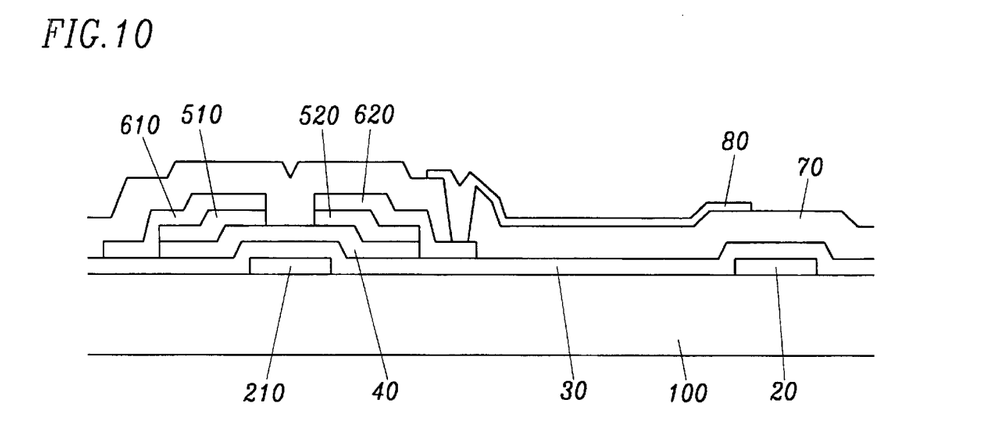
FIG. 10 is a sectional view taken along the line X–X' of FIG. 9.

FIG. 9 is a layout view of a liquid crystal display according to an embodiment of the present invention, and FIG. 10 is a sectional view taken along the line X–X' of FIG. 9.

As shown in FIGS 9 and 10, a plurality of spaced apart gate lines 10 and 20 transmitting scanning signals are formed on a transparent insulating substrate 100. Portions 210 of the gate lines 10 and 20 serve as gate electrodes of thin film transistors, which are electrically connected to the gate lines 10 and 20. The gate lines 10 and 20 and the gate electrodes 210 are covered with the gate insulating layer 30. A plurality of spaced apart data lines 60, and an array of channel layers 40 of the thin film transistors are formed on the gate insulating layer 30. The channel layers 40 are opposite the gate electrodes 210 with respect to the gate insulating layer 30 and are insulated from the gate electrodes 210. The channel layers 40 are made of a semiconductor such as amorphous silicon. It will be understood that although the data lines in FIG. 9 extend longitudinally and the gate lines extend transversely, other arrangements may be used.

Continuing with the descriptions of FIGS. 9 and 10, an ohmic contact layer of the thin film transistor having two portions 510 and 520 are formed on the channel layer 40, and are made of a material which reduces the contact resistance between a semiconductor and a metal such as doped amorphous silicon layer. The two portions 510 and 520 are opposite each other with respect to the gate electrode 210. A source and a drain electrodes 610 and 620 of the thin film transistor are formed on the respective portions 510 and 520 of the ohmic contact layer. The source electrode 610 is connected to the data line 60 to transmit image signals.

Still referring to FIGS. 9 and 10, a passivation layer 70 made of a material such as silicon nitride is formed thereon and has a contact hole 71 exposing the drain electrode 620. A pixel electrode 80 made of a transparent conductive material such as indium tin oxide (ITO) is formed on the passivation layer 70. The pixel electrode 80 is connected to the drain electrode 620 through the contact hole 71, and overlaps the gate line 10.

Now, a manufacturing method of a liquid crystal display is described in detail with reference to FIGS. 11A to 11D.

Figure 11A:
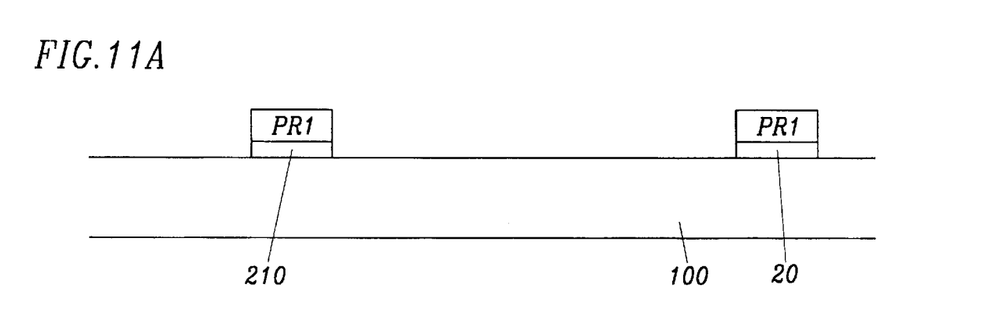
FIGS. 11A to 11D is sectional views of a liquid crystal display of FIGS. 9 and 10 during intermediate manufacturing steps.

As shown in FIG. 11A, a metal layer of such as aluminum is deposited on a substrate 100, and a photoresist PR1 is coated on the metal layer. The photoresist PR1 is exposed to light using a mask having a gate pattern. At this time, the photoresist PR1 is exposed using the above-described exposing technique. The photoresist PR1 is developed and the metal layer is patterned to form a plurality of spaced apart gate lines 20 and an array of gate electrodes 210.

Figure 11B:
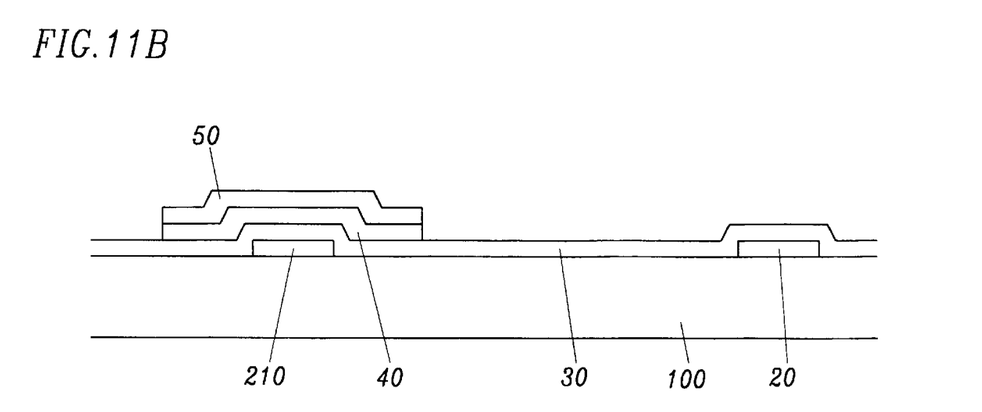

As shown in FIG. 11B, the photoresist PR1 is removed, and a silicon nitride layer 30, amorphous silicon layer 40 and a doped amorphous silicon layer 50 are deposited in sequence. The doped amorphous silicon layer 50 and the amorphous silicon layer 40 are then patterned to form active pattern by using photolithography. The above-described exposing method may be used.

Figure 11C:
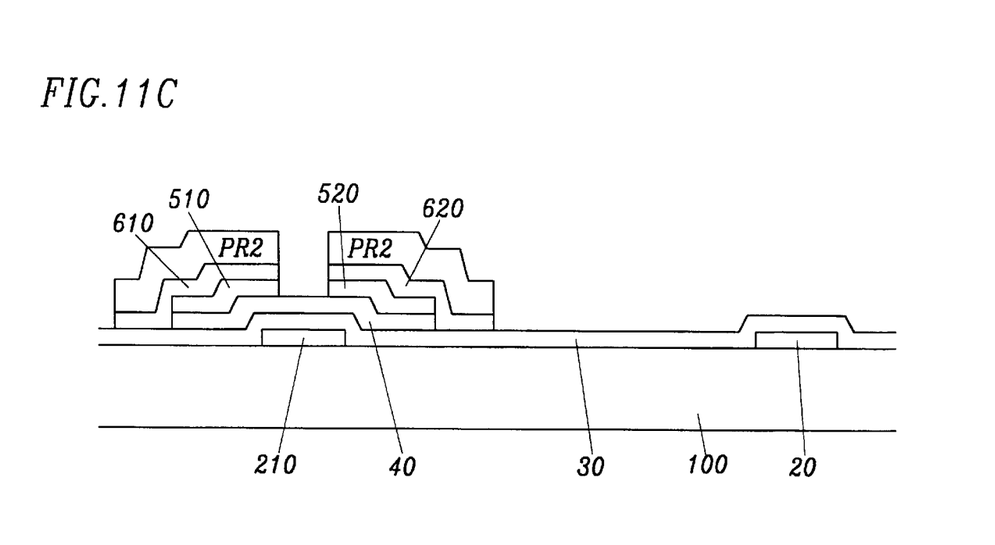

As shown in FIG. 11C, a metal layer of such as chromium is deposited and a photoresist PR2 is coated, exposed to light using the above-described technique, and developed, The metal layer is etched by using the photoresist PR2 as an etch mask to form a data line 60, a source and a drain electrodes 610 and 620. The doped amorphous silicon layer 50 is then etched by using the data line 60 and the source and the drain electrodes 610 and 620 to form an ohmic contact layer 510 and 520.

Figure 11D:
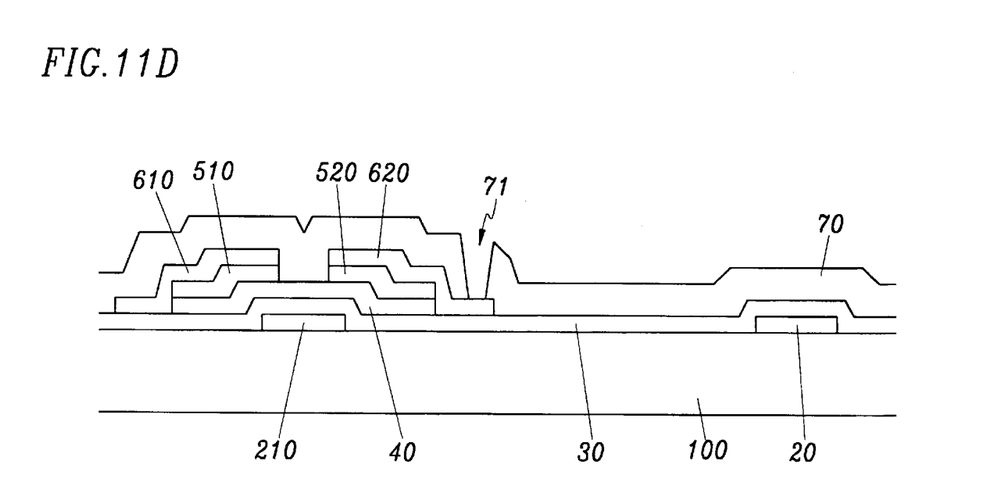

As shown in FIG. 11D, a passivation layer 70 made of silicon nitride or organic insulating material is formed thereon, and a contact hole 620 is formed in the passivational layer 70.

Finally, as shown in FIGS. 9 and 10, a transparent conductive layer of such as ITO is deposited and is patterned to form pixel electrodes using the above described exposing method.

Figure 12:
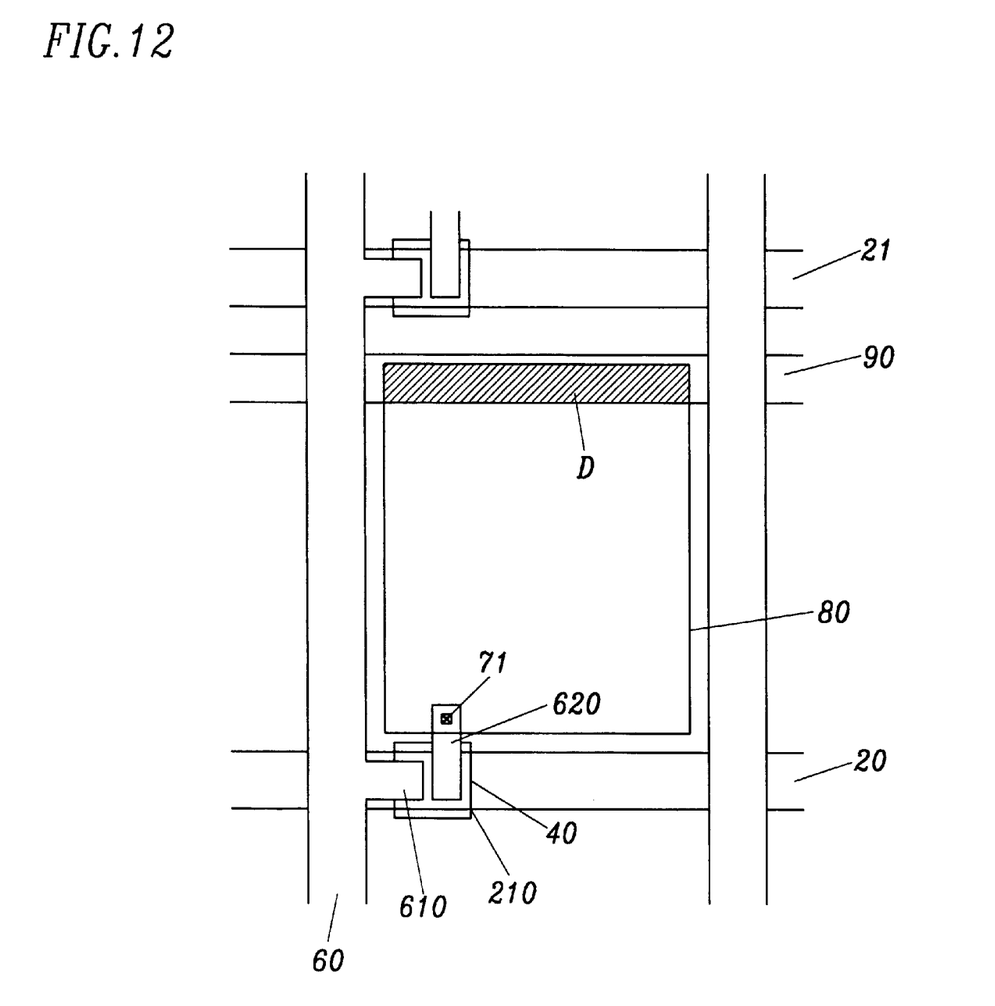
FIG. 12 is a layout view of a liquid crystal display according to another embodiment of the present invention.

FIG. 12 is a layout view showing another embodiment of a liquid crystal display.

The liquid crystal display shown in FIG. 12 has a similar structure and is manufactured by the similar method to the liquid crystal display shown in FIGS. 9 and 10 except for a storage electrode 90. The storage electrode 90 is formed on a substrate 100 and covered with a gate insulating layer 30, and overlaps the pixel electrode 80 to form a storage capacitor. The storage electrode 90 is simultaneously formed with a gate line, separated from a gate line 10 and parallel to the gate line.

As described above, the brightness of the liquid crystal display may be affected by the kickback voltage, which depends on parasitic capacitance A between the gate electrode 210 and the drain electrode 620, and a storage capacitance B between the gate line 10 and the pixel electrode 80. The brightness also depends on a parasitic capacitance C between the data line 60 and the pixel electrode 80. When these capacitances are different between the exposure regions, the kickback voltages are different between the regions and the kickback voltage difference may yield the brightness difference between the exposure regions.

However, by using the exposing method according to the present invention the brightness difference is not easily detectable by the users.

The exposure regions and the boundary regions according to the present invention may be the same or different for the layers.

The exposing method according to the present invention may be adapted to another fields which uses the step-and-repeat exposing technique such as semiconductor devices.

In the drawings and specification, there have been disclosed typical preferred embodiments of the present invention and, although specific terms are employed, they are used in a generic and descriptive sense only and not for purposes of limitation, the scope of the invention being set forth in the following claims.

What is claimed is:

1. A method for manufacturing a liquid crystal display having a plurality of pixels comprising the steps of:

forming a gate pattern including a plurality of spaced apart gate lines and an array of gate electrodes electrically connected thereto on a substrate;

forming an array of channel layers insulated from the gate electrodes;

forming an array of spaced apart source and drain electrodes on the channel layers; and forming an array of pixel electrodes respectively connected to the drain electrodes;

wherein at least one of the steps includes the sub-steps of:
coating a photoresist,
dividing the photoresist into first and second regions and a boundary region between the first and the second regions, the boundary region having a plurality of first portions and a plurality of second portions,
exposing the first region and the first portions to light through a first mask, and
exposing the second region and the second portions to light through a second mask, wherein the first region, the boundary region and the second region are sequentially arranged in a first direction, the first and the second portions are arranged in a matrix which has a plurality of rows extending in the first direction and a plurality of columns extending in a second direction substantially perpendicular to the first direction, the total area of the second portions with respect to the total area of the first portions in each column becoming larger along the first direction from the first region to the second region; and wherein the first and second portions in each row are arranged irregularly.

2. The method of claim 1, further comprising the step of forming a plurality of storage electrodes which overlap the pixel electrodes and are insulated from the pixel electrodes.

3. The method of claim 1, wherein each pixel comprises one of the pixel electrodes and a thin film transistor having a respective one of the gate electrodes, the channel layers, the source electrodes and the drain electrodes, and each of the first and the second portions corresponds to a plurality of the pixels.

4. The method of claim 1, wherein each of the rows and the columns includes at least two boundaries between the first and second portions.

5. The method of claim 1, wherein the first and the second portions have substantially the same area.

6. The method of claim 5, wherein the first and the second portions are square or rectangular-shaped.

7. The method of claim 1, wherein the plurality of columns is nine columns.

* * * * *